United States Patent
Ohtake

(10) Patent No.: US 6,507,526 B2
(45) Date of Patent: Jan. 14, 2003

(54) SEMICONDUCTOR MEMORY WITH IMPROVED AUTO PRECHARGE

(75) Inventor: Hiroyuki Ohtake, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/894,323

(22) Filed: Jun. 27, 2001

(65) Prior Publication Data

US 2002/0001244 A1 Jan. 3, 2002

(30) Foreign Application Priority Data

Jun. 28, 2000 (JP) ........................................ 2000-195173

(51) Int. Cl.[7] ................................................ G11C 7/00
(52) U.S. Cl. ........................................ 365/203; 365/191
(58) Field of Search ................................ 365/203, 193, 365/191, 222, 233.5, 230.3; 711/150

(56) References Cited

U.S. PATENT DOCUMENTS

| | | | | |
|---|---|---|---|---|
| 5,636,173 A | * | 6/1997 | Schaefer | 365/230.3 |
| 5,950,229 A | * | 9/1999 | Jeddeloh | 711/150 |
| 6,134,169 A | * | 10/2000 | Tanaka | 365/222 |
| 6,166,993 A | * | 12/2000 | Yamauchi | 365/233.5 |
| 6,242,936 B1 | * | 5/2001 | Ho et al. | 324/765 |
| 6,246,614 B1 | * | 6/2001 | Ooishi | 365/191 |
| 6,343,036 B1 | * | 1/2002 | Park et al. | 365/193 |

FOREIGN PATENT DOCUMENTS

| | | |
|---|---|---|
| JP | 9-63264 | 3/1997 |
| JP | 9-180455 | 7/1997 |

* cited by examiner

*Primary Examiner*—David Nelms
*Assistant Examiner*—Thinh Nguyen
(74) *Attorney, Agent, or Firm*—Hogan & Hartson, LLP

(57) ABSTRACT

When a write & auto precharge command is input into a chip, signals CPSRX and AUTPL are at "H". After finishing a column operation, the level of the signal CPSRX shift to "L". When CPSRX="L" and AUTPL="H", if a signal CSLCK is at "H", an auto precharge enable signal AUTPE is at "H". The signal AUTPE is at "H" when the signal CSLCK is at "H", and does not depend upon the leading edge of an external clock VCLK. Since auto precharge is executed from the time a column select line CSL is activated, the time the potential of a selected word line is shifted to a non-selection level can be kept constant irrespective of the frequency of the external clock.

11 Claims, 9 Drawing Sheets

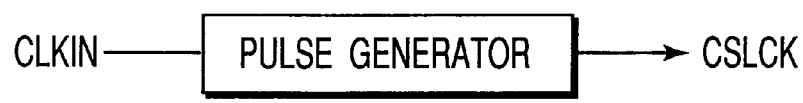
F I G. 10
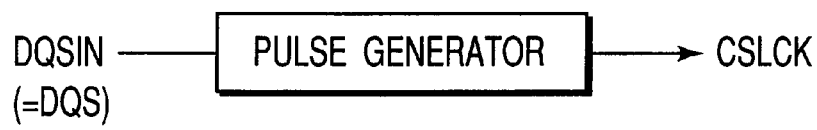
F I G. 11
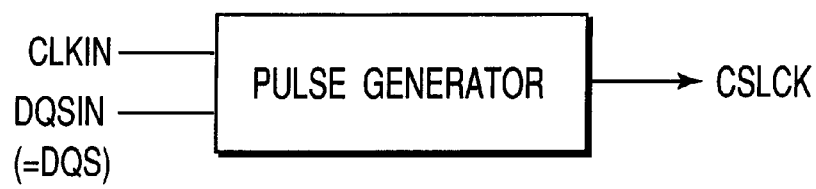
F I G. 12
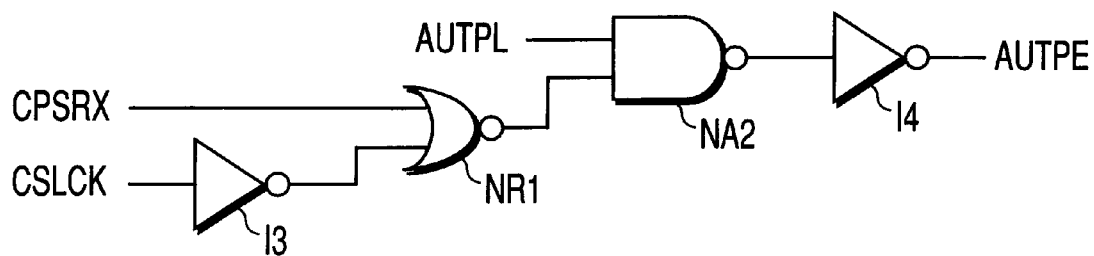
F I G. 13

SEMICONDUCTOR MEMORY WITH IMPROVED AUTO PRECHARGE

CROSS-REFERENCE TO RELATED APPLICATIONS

This application is based upon and claims the benefit of priority from the prior Japanese Patent Application No. 2000-195173, filed Jun. 28, 2000, the entire contents of which are incorporated herein by reference.

BACKGROUND OF THE INVENTION

1. Field of the Invention

The present invention relates to a semiconductor memory, and more particularly, a synchronous DRAM that executes an auto precharge operation.

2. Description of the Related Art

A synchronous DRAM (hereinafter referred to as an "SDRAM") that operates in synchronism with an external clock has an operation mode called "auto precharge (bank precharge)".

In the auto precharge mode, in the memory chip of the DRAM, the potential of a presently-selected word line in a bank automatically shifts to a non-selection potential (e.g. the ground potential), and preparation processing for the next processing (for example, shifting the potential of a word line in the same bank to be selected next to a selection potential), i.e. bank precharge, is executed.

FIG. 1 shows an essential part of a conventional SDRAM having the auto precharge mode.

In the structure shown in FIG. 1, in the write mode, a burst length counter 12 is activated to thereby latch a burst signal and set a column select line enable signal CPSRX at "H". When the level of the column select line enable signal CPSRX rises to "H", a column clock generator 13 is activated. The column clock generator 13 outputs a control signal CSLCK for controlling the potential of a column select line CSL.

A clock CLKIN (=VCLK) is input to the column clock generator 13 and an auto precharge shift register 15. After finishing the column burst operation, the column select line enable signal CPSRX lowers to "L".

When a write & auto precharge command is input to an input receiver/command decoder 11, an auto precharge signal AUTPL is input to an auto precharge decoder 14. The auto precharge decoder 14, in turn, generates an auto precharge enable signal AUTPE based on the column select line enable signal CPSRX and the auto precharge signal AUTPL.

The auto precharge enable signal AUTPE is input to the auto precharge shift register 15, where it is shifted by tWR in synchronism with the clock CLKIN and output as a signal AUTPG. A bank controller 16 outputs a bank precharge signal BNK based on the signal AUTPG. As a result, bank precharge is executed, and the potential WL of a presently-selected word line is shifted from the selection potential to a non-selection potential.

FIG. 2 illustrates a concrete example of the auto precharge decoder 14 appearing in FIG. 1. The auto precharge decoder 14 comprises inverters 11 and 12 and a NAND circuit NA1. Further, FIGS. 3A and 3B illustrate a concrete example of the auto precharge shift register 15 appearing in FIG. 1.

FIG. 4 shows signal waveforms in the write & auto precharge mode.

The auto precharge mode is provided in, for example, a double data rate (DDR) type SDRAM.

In the write operation of the DDR type SDRAM, data VDQ is not input into the chip in synchronism with a command cycle, but a predetermined clock cycle is necessary until the data is started to be input after the command cycle finishes. This is called "write latency (hereinafter referred to as "WCL")". In the waveforms of FIG. 4, WCL is set at 1.

Further, in the DDR type SDRAM, when inputting the data VDQ into the chip, a dedicated input trigger, called "DQS (=VDQS)", is used. Specifically, the data VDQ is input into the chip in synchronism with the edges of the trigger DQS. Further, the trigger DQS usually has a phase shift from an external clock VCLK. This phase shift is called a "DQS skew". In the waveforms in FIG. 4, the DQS skew is set at 0.

In the write operation, data is input into the chip, and then the potential of the column select line CSL is raised, thereby writing the data into the memory cells of a selected column. For this reason, when writing a plurality of continuously input data items into memory cells, a predetermined time period is required after all the data items are input to the chip until the last data item is actually written into a memory cell.

To secure the predetermined time period, a write recovery time tWR is prepared. The write recovery time tWR is the period of time that elapses from the time the first external clock pulse signal occurs immediately after the input of the last data item into the chip, to the time the next external clock pulse occurs. In the DDR type SDRAM, the bank precharge command is not allowed to be input into the chip until said next external clock pulse occurs.

This is because if the bank precharge command is input into the chip before the write recovery time tWR elapses, bank precharge is started and the potential of the presently-selected work line WL shifts to the non-selection level, for the next operation, before the last data item is written into a memory cell, resulting in a write error.

The process of setting the write recovery time tWR is, of course, required even in the write & auto precharge mode in which no precharge command is needed.

In the write & auto precharge mode, the auto precharge enable signal AUTPE is shifted by tWR using the external clock VCLK (=CLKIN), thereby executing bank precharge and shifting the potential of the presently-selected work line WL to the non-selection level for the next operation after the last data item is written into the chip.

The above operation will be described in more detail. First, when a bank active command BA is input, the level of a bank active signal BNK rises to "H", thereby raising the potential of a word line WL selected by a row address signal. Subsequently, a write command WT is input, whereby a burst enable signal CPSRX is activated, i.e. rises to "H", after a number of pulses of the external clock corresponding to the write latency WCL are output. As a result, an operation for column selection is started.

More specifically, when the burst enable signal CPSRX is at "H", the external clocks VCLK and DQS are input, whereby the column dedicated clock CSLCK rises to "H" to activate the column decoder. Consequently, the potential of the column select line CSL is raised on the basis of a column address signal, thereby writing data into a memory cell selected by the selected column.

After the last one of continuous data items having a predetermined burst length is written into a memory cell, bank precharge is executed and the potential of the presently-selected word line WL is lowered, in preparation for the next processing (for, for example, shifting the potential of a word line in the same bank to be selected next to the selection potential).

In the waveforms of FIG. 4, since tWR=1, the potential of the word line WL is lowered when one pulse of the external clock has risen after the rising of one pulse of the external clock immediately after the last data item is input into the chip.

In order to write all the continuous data items of the predetermined burst length into memory cells, the time Δt1 required from the rising of the potential of the column select line CSL to the falling of that of the selected word line WL must be greater than the time Δt2 required from the rising of the potential of the column select line CSL to the writing of all the data items into the memory cells, as is shown in FIG. 5.

When Δt1>Δt2, the difference Δt3 therebetween acts as a margin for the time required for writing data into the memory cells.

In general, in the waveforms shown in FIG. 5, the number of clock pulses defines tWR. If the number of clock pulses that define tWR is constant (e.g. 1), the faster the transistors operate or the higher the frequency of the external clock, the shorter Δt1 is.

However, Δt2 is the time necessary to write all data into the memory cells, and hence significantly depends upon the capacity and resistance, etc. of bit lines BL or the memory cells. Accordingly, even when the transistors operate at high speed or the frequency of the external clock is high, Δt2 is not as shortened as Δt1.

This being so, the margin Δt3 for the time required to write data into memory cells becomes very short. In some cases, Δt3 disappears and Δt2 is greater than Δt1, thereby causing a write error, as is shown in FIG. 6.

Furthermore, in a DDR type SDRAM having the signal DQS, it is possible that a skew of "Δt4" may occur between the data input signal VDQS (=DQS) and the external clock VCLK (=CLKIN) as shown in FIG. 7. Since the column select line CSL is activated in synchronism with the signal DQS, if the signal DQS delays from the external clock VCLK, the column select line CSL is activated after a period of time corresponding to the delay of the signal DQS elapses. Accordingly, the time required for writing data into memory cells is lengthened.

The point of time at which the potential of the selected word line WL is lowered corresponds to the rising time of the external clock VCLK, and hence is always constant. Accordingly, it is possible that the time required for writing data into memory cells is lengthened, the margin Δt3 disappears, and Δt2 becomes greater than Δt1, thereby causing a write error, as is shown in FIG. 7.

To prevent the write error, a method could be devised where the number of clock pulses for determining tWR is increased, for example, from 1 to 2, as is shown in FIG. 8. In this case, since the point of time at which the level of the signal AUTPG rises to "H" delays, the time Δt1 is lengthened which is required until the potential of the word lines is lowered after the potential of the column line CSL is raised. Accordingly, the difference Δt3 between Δt1 and Δt2 (required until data is written into memory cells after the potential of the column select line CSL is raised) can be secured, thereby preventing write errors.

In the prior art, however, the above-mentioned measure, i.e. shifting the auto precharge enable signal AUTPE by two clock pulses, using the clock CLKIN, requires a big change in the circuit structure of the auto precharge shift register 15 shown in FIG. 1. In other words, the existing circuit (tWR corresponds to one clock pulse) cannot be used without changes, and a lot of time is required to design and develop a suitable circuit.

BRIEF SUMMARY OF THE INVENTION

It is the object of the present invention to provide a semiconductor memory completely free from a write error without changing the number of clock pulses that defines a write recovery time tWR (i.e. without a big change in circuit structure), even if the transistors incorporated therein are designed to operate at higher speeds and/or the frequency of an external clock is increased.

To attain the object, there is provided a semiconductor memory comprising: a generator for generating a pulse signal, used to operate a column decoder, on the basis of a clock signal and a first control signal; a precharge decoder for outputting a second control signal, used to control an operation of a row decoder, on the basis of the first control signal and the pulse signal; and a delay circuit operable independent of the clock signal for delaying the second control signal by a predetermined time period.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 10 is a view illustrating a first example of a circuit for creating a signal CSLCK;

FIG. 11 is a view illustrating a second example of the circuit for creating the signal CSLCK;

FIG. 12 is a view illustrating a third example of the circuit for creating the signal CSLCK;

FIG. 13 is a view illustrating an example of an auto precharge decoder;

DETAILED DESCRIPTION OF THE INVENTION

A semiconductor memory according to the present invention will be described in detail with reference to the accompanying drawings.

[Outline]

Figure 1:
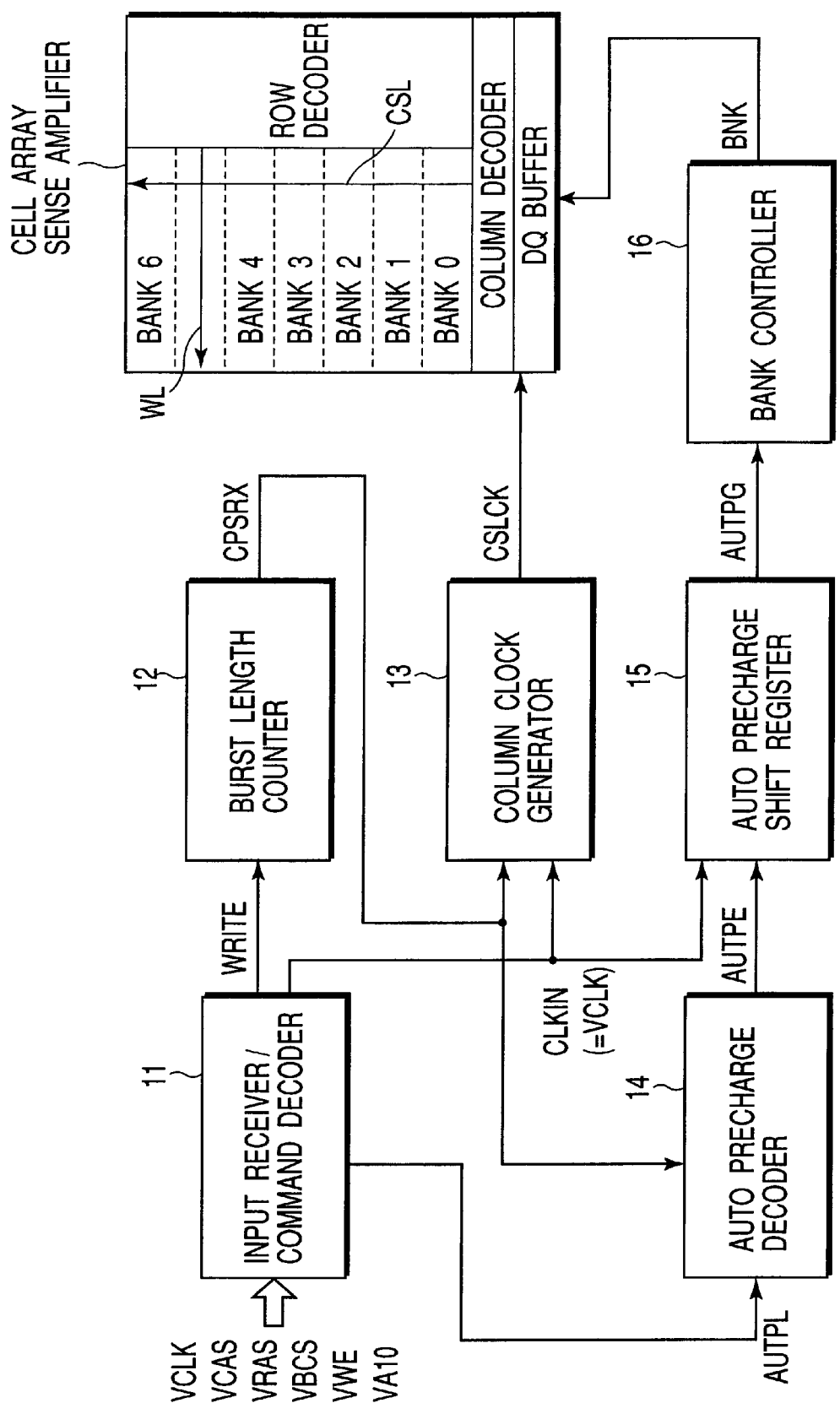
FIG. 1 is a block diagram illustrating a conventional circuit for executing a write & precharge operation.
Figure 2:
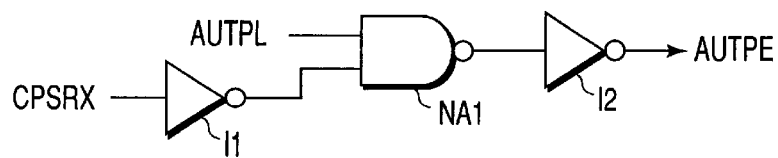
FIG. 2 is a circuit diagram illustrating a conventional auto precharge decoder.
Figure 3A:
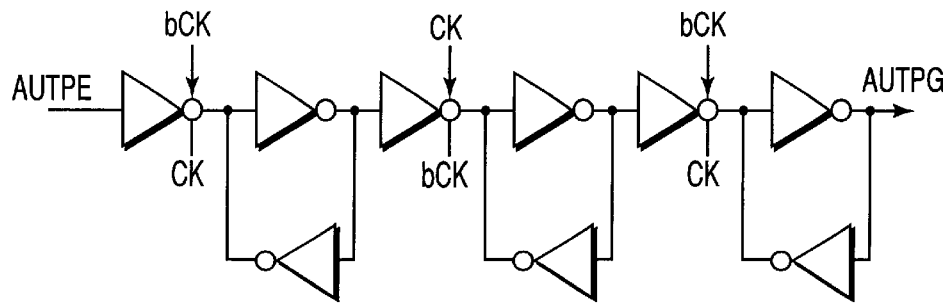
FIGS. 3A and 3B are circuit diagrams illustrating a conventional auto precharge shift register.
Figure 3B:
Figure 4:
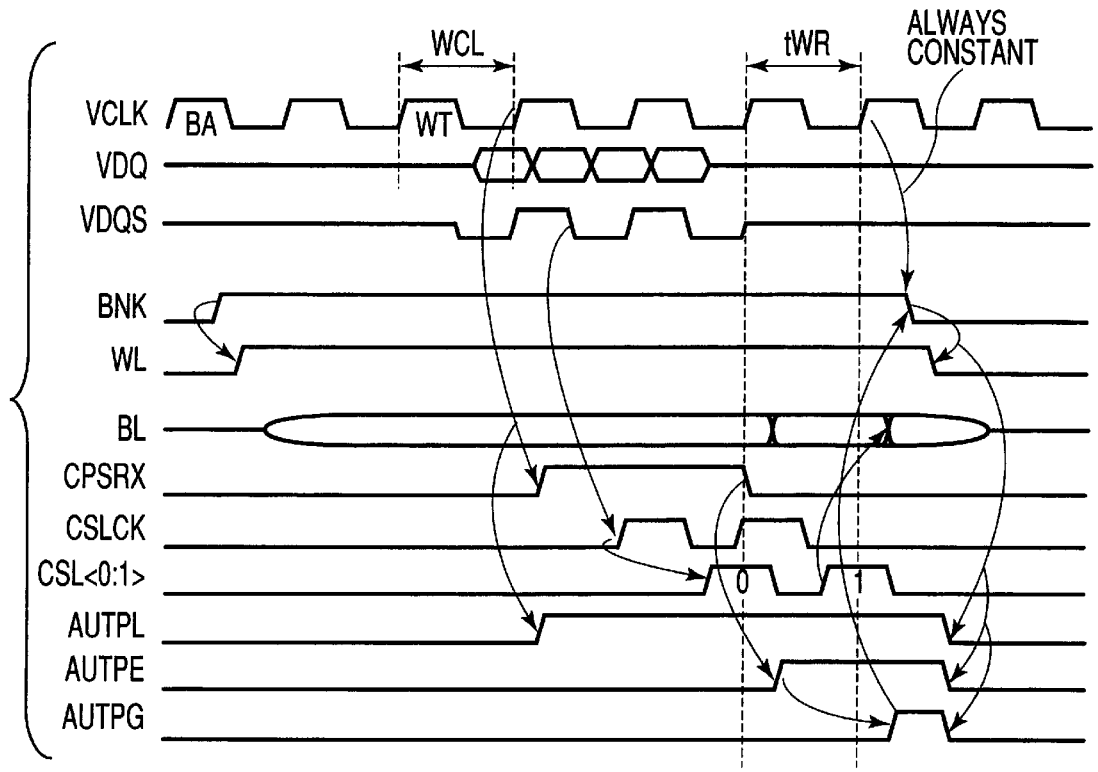
FIG. 4 is a view of signal waveforms used to execute a conventional write & auto precharge operation.
Figure 5:
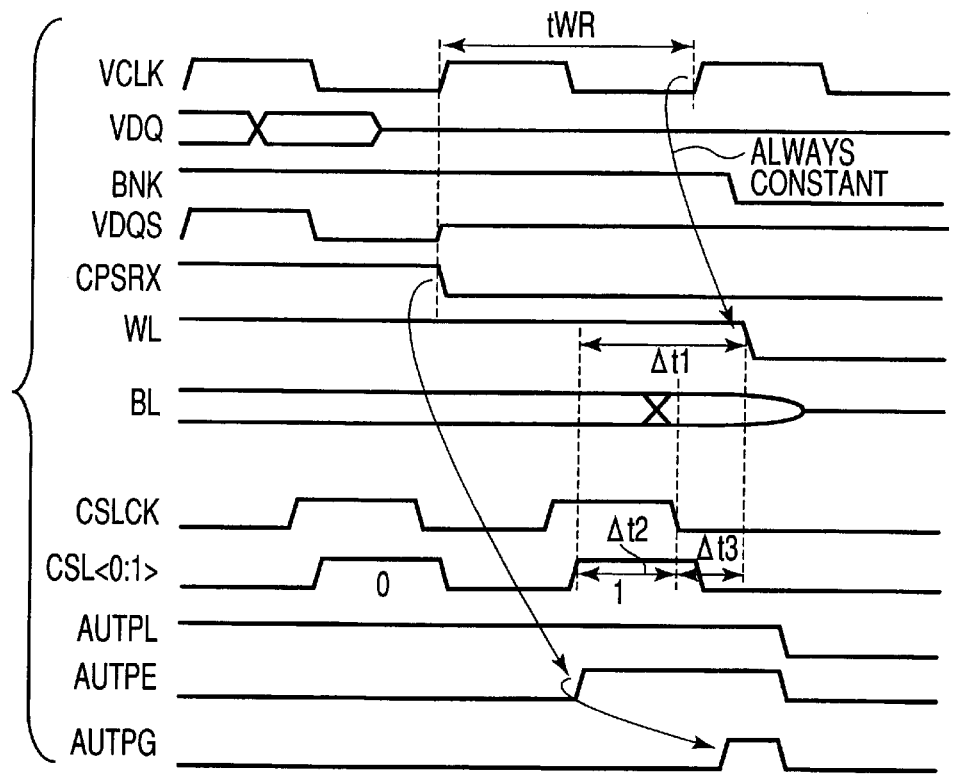
FIG. 5 is a view of signal waveforms used to execute a conventional write & auto precharge operation.
Figure 6:
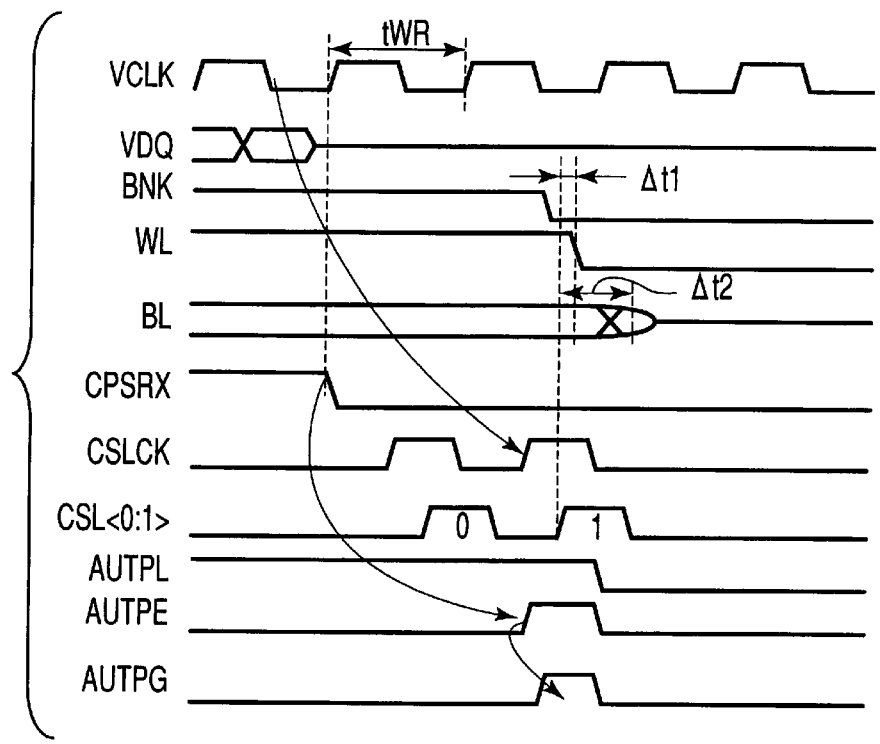
FIG. 6 is a view of signal waveforms obtained when the frequency of a clock is increased in FIG. 4.
Figure 7:
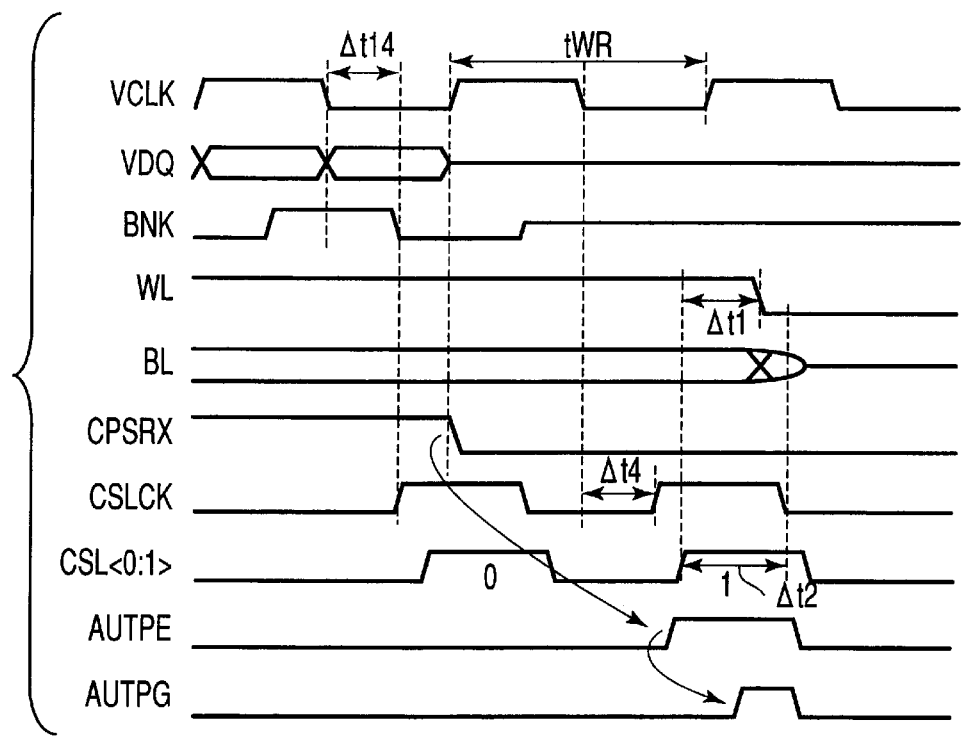
FIG. 7 is a view of signal waveforms obtained when a signal DQS delays in FIG. 4.

The present invention is characterized in that a clock CSLCK for activating a column select line CSL is used as a signal for starting an auto precharge operation, and the leading edge of an external clock pulse is not used to start the auto precharge operation. Furthermore, in the present invention, an auto precharge delay circuit is used to execute auto precharge control, in place of the conventional auto precharge shift register (denoted by reference numeral 15 in FIG. 1).

Auto precharge (bank precharge) is arranged to be executed in preparation of the next operation when the column select line CSL has shifted to its active state (CSLCK="H"). Further, the auto precharge delay circuit is used to adjust the point of time at which the potential of a selected word line is shifted to its non-selection potential (is lowered). As a result, the point of time at which the potential of the word lines is lowered (WL="L") does not depend upon the frequency of an external clock VCLK but is kept constant. In other words, the potential of the word lines is always lowered after the writing of data into memory cells is completed.

Figure 9:
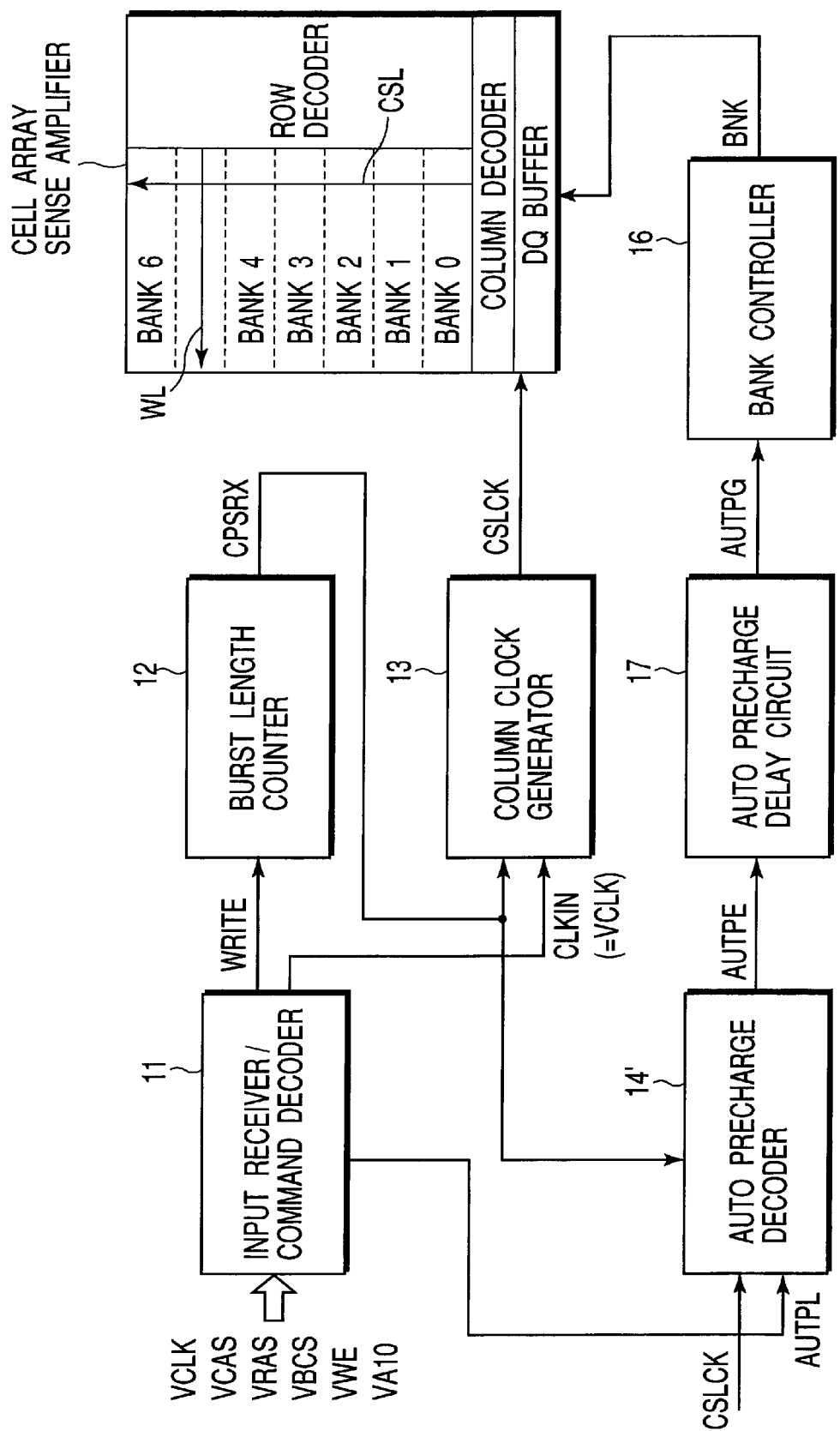
FIG. 9 is a block diagram illustrating a circuit for executing a write & auto precharge operation incorporated in the present invention.

FIG. 9 shows an essential part of an SDRAM having an auto precharge mode and according to the present invention.

In the write mode, a burst length counter 12 is activated to thereby latch a burst signal and set a column select line enable signal CPSRX at "H". When the level of the column select line enable signal CPSRX rises to "H", a column clock generator 13 is activated. The column clock generator 13 outputs a control signal CSLCK for controlling the potential of a column select line CSL.

A clock CLKIN (=VCLK) is input to the column clock generator 13 but not to an auto precharge delay circuit 17 that is provided in place of the conventional auto precharge shift register 15. After finishing the column burst operation, the column select line enable signal CPSRX lowers to "L".

When a write & auto precharge command is input to an input receiver/command decoder 11, an auto precharge signal AUTPL is input to an auto precharge decoder 14'. The auto precharge decoder 14', in turn, generates an auto precharge enable signal AUTPE based on the control signal CSLCK and the auto precharge signal AUTPL.

The auto precharge enable signal AUTPE is input to the auto precharge delay circuit 17, where it is shifted by tWR and output as a control signal AUTPG. A bank controller 16 outputs a bank precharge signal BNK based on the control signal AUTPG. As a result, bank precharge is executed, and the potential WL of the presently-selected word line is lowered.

FIGS. 10–12 illustrate a concrete example of circuits for generating the control signal CSLCK supplied to the auto precharge decoder 14' appearing in FIG. 9. However, in place of using the circuits shown in FIGS. 10–12, the output signal CSLCK of the column clock generator 13 shown in FIG. 9 may be input to the auto precharge decoder 14'.

Figure 14:
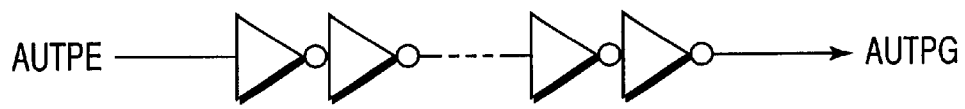
FIG. 14 is a view illustrating a first example of an auto precharge delay circuit.
Figure 15:
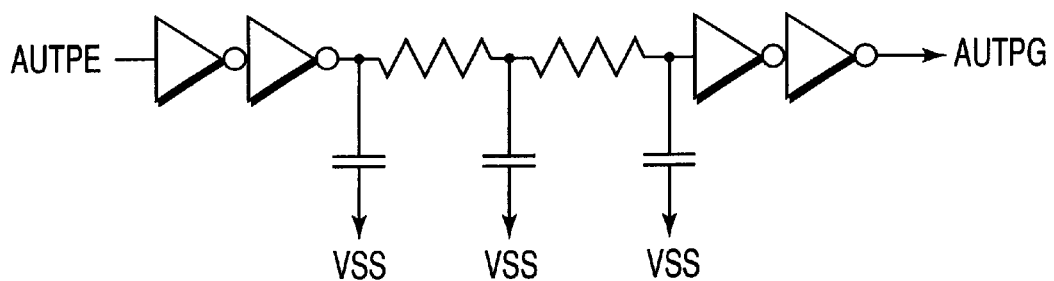
FIG. 15 is a view illustrating a second example of the auto precharge delay circuit.

FIG. 13 shows a concrete example of the auto precharge decoder 14'. The auto precharge decoder 14' comprises inverters 13 and 14, a NAND circuit NA12 and a NOR circuit NR1. Further, FIGS. 14 and 15 illustrate concrete examples of the auto precharge delay circuit 17 appearing in FIG. 9.

FIRST EXAMPLE

Figure 16:
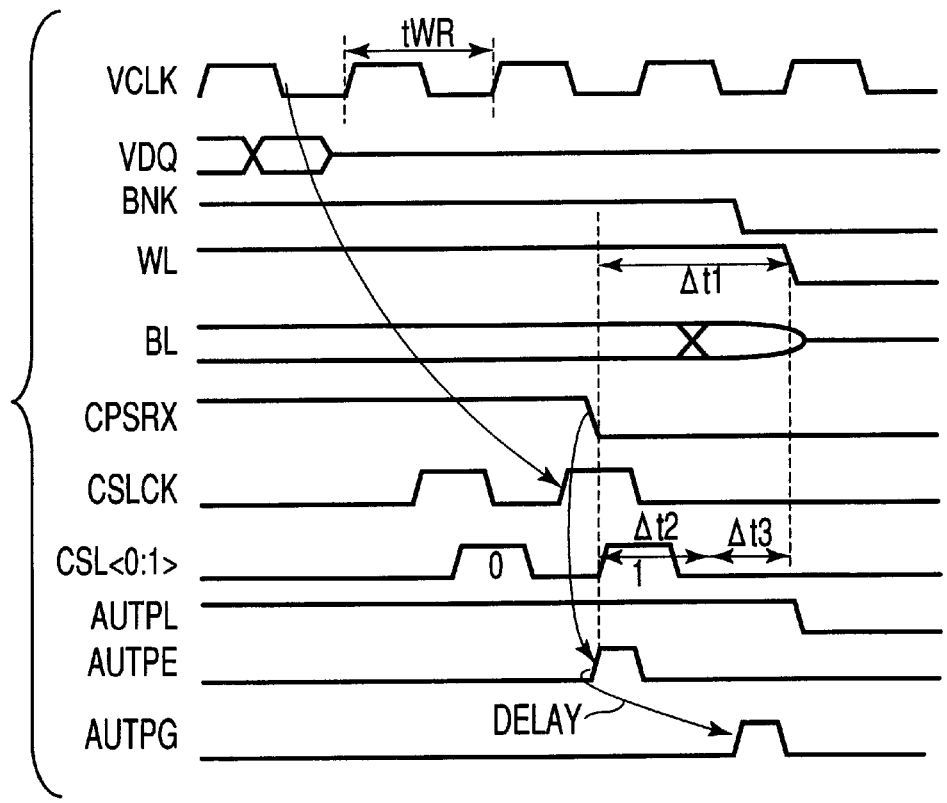
FIG. 16 is a view of signal waveforms used in a first example of the present invention.

FIG. 16 shows signal waveforms used in the write & auto precharge mode in a first example of the present invention.

Referring now to FIGS. 9 and 16, the operation of the first example will be described.

In the first example, a clock is used to input data into the chip, and no DQS signal is used. Accordingly, a control pulse signal CSLCK for activating the column select line CSL is created in synchronism with the trailing edge of the clock CLKIN (=VCLK). The pulse signal input to the auto precharge decoder 14' is generated by, for example, a pulse generator as shown in FIG. 10.

When the write & auto precharge command is input to the chip, the column select line enable signal CPSRX and the auto precharge signal AUTPL assume their active states ("H"), as in the conventional case. After finishing the column burst operation, the column select line enable signal CPSRX lowers to "L", as in the conventional case.

When CPSRX="L" and AUTPL="H", if CSLCK="H", the level of the output signal (auto precharge enable signal) AUTPE of the auto precharge decoder 14' shown in FIGS. 9 and 13 rises to "H". Thus, in the present invention, the level of the auto precharge enable signal for starting auto precharge rises to "H" if the level of the control signal CSLCK rises to "H". In other words, the point of time at which the level of the auto precharge enable signal rises to "H" does not depend upon the leading edge of the external clock VCLK, unlike the conventional case.

The auto precharge enable signal AUTPE (="H") is delayed by a predetermined period by the auto precharge delay circuit shown in FIG. 14 or 15, and then output as a control signal AUTPG (="H"). The bank controller 16 outputs a bank precharge signal BNK based on the control signal AUTPG. As a result, bank precharge is started and the potential of a selected word line WL is lowered.

The period of time delayed by the auto precharge delay circuit 17 shown in FIG. 9 (specifically shown in FIG. 14 or 15) is determined on the basis of the relationship between the time required until data is substantially written into memory cells after the column select line CSL is activated, and the time required until the potential of the selected word line is lowered after the start of the bank precharge operation.

Although, in this example, even when the frequency of the external clock is high, the column select line CSL is kept in the active state. Accordingly, bank precharge is started and the potential of the selected word line WL is lowered, after data is substantially written into memory cells. For this reason, no write error will occur.

Figure 8:
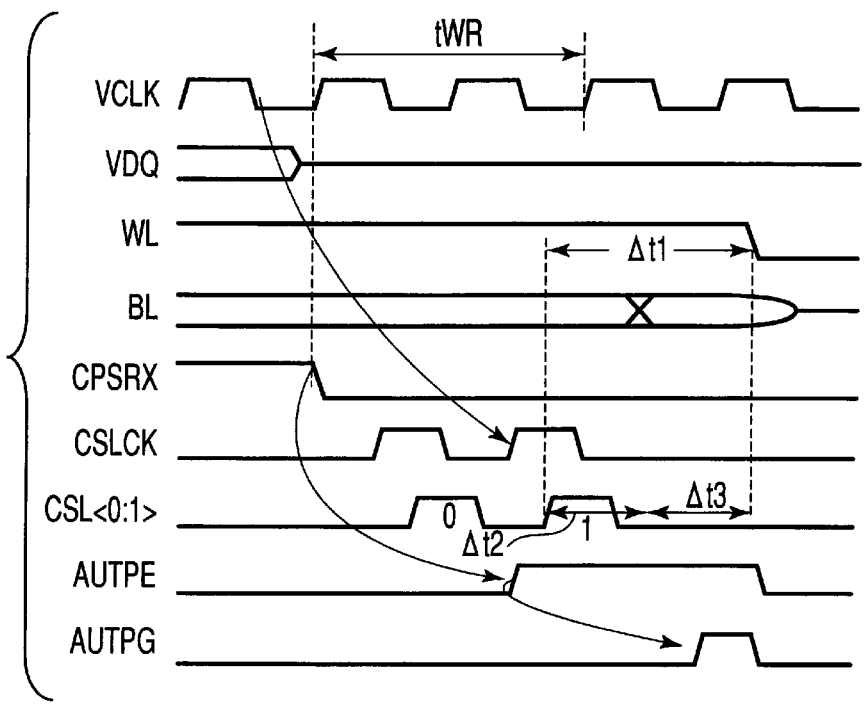
FIG. 8 is a view of signal waveforms obtained when tWR corresponds to two clock pulses in FIG. 6.

Furthermore, when the frequency of the external clock is high, the number of clock pulses that define the write recovery time tWR is increased (see FIG. 8) as in the conventional case. However, even in this case, no circuit for shifting the auto precharge enable signal AUTPE in synchronism with the clock is necessary. This means that it is sufficient.if the existing auto precharge delay circuit is used, and therefore the time required for designing and developing the semiconductor memory can be shortened.

SECOND EXAMPLE

Figure 17:
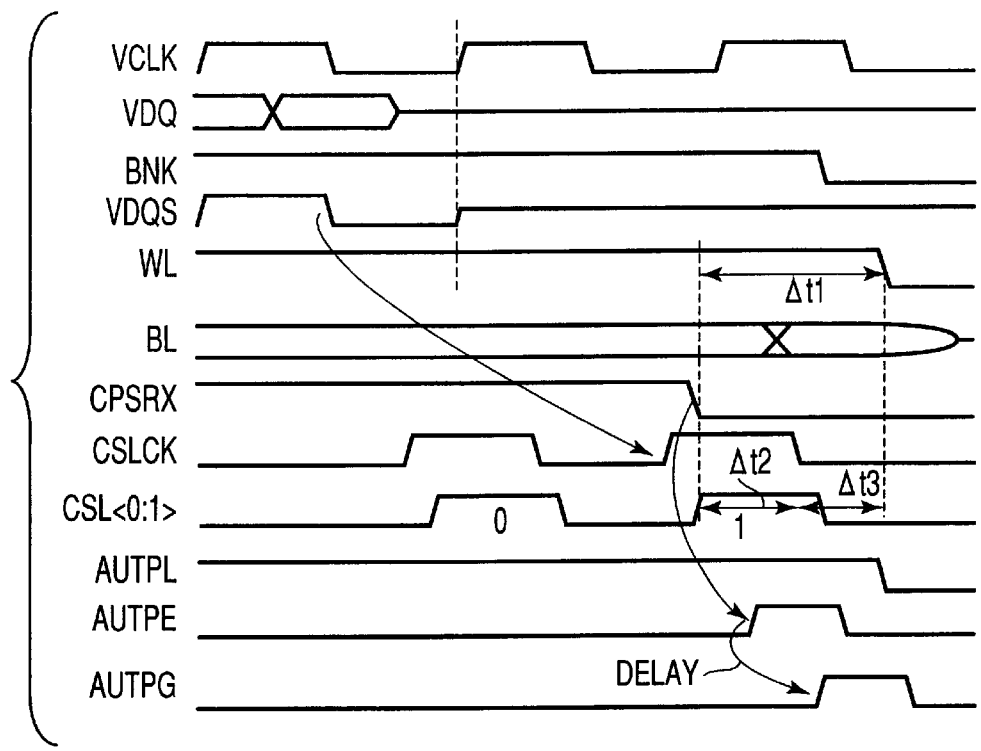
FIG. 17 is a view of signal waveforms used in a second example of the present invention.

FIG. 17 shows signal waveforms used in the write & auto precharge mode in a second example of the present invention.

Referring to FIGS. 9 and 17, the operation of the second example will be described.

The second example is directed to a semiconductor memory in which data is input into the chip in synchronism with the DQS signal that delays from the clock. The pulse signal CSLCK to be input to the auto precharge decoder 14' is generated by a pulse generator as shown in FIG. 11.

When the write & auto precharge command is input to the chip, the column select line enable signal CPSRX and the auto precharge signal AUTPL assume their active states ("H") as in the conventional case. After finishing the column burst operation, the column select line enable signal CPSRX lowers to "L", as in the conventional case. Further, in this example, since data is input into the chip in synchronism with the DQS signal, the control signal CSLCK is raised to "H" by the pulse generator shown in FIG. 11 when the DQS signal has been lowered.

When CPSRX="L" and AUTPL="H", if CSLCK="H", the level of the output signal (auto precharge enable signal) AUTPE of the auto precharge decoder 14' shown in FIGS. 9 and 13 rises to "H". Thus, in the present invention, the auto precharge enable signal for starting auto precharge rises to "H" if the control signal CSLCK rises to "H". In other words, the point of time at which the auto precharge enable signal rises to "H" does not depend upon the leading edge of the external clock VCLK, unlike the conventional case.

The auto precharge enable signal AUTPE (="H") is delayed by a predetermined period by the auto precharge delay circuit shown in FIG. 14 or 15, and then output as a control signal AUTPG (="H"). The bank controller 16 outputs a bank precharge signal BNK based on the control signal AUTPG. As a result, bank precharge is started and the potential of a selected word line WL is lowered.

In this example, if a skew of Δt4 exists between the clock VCLK (=CLKIN) and the signal VDQS (=DQS), and the signal DQS delays by Δt4 from the clock VCLK, the pulse signal CSLCK also delays by Δt4.

In the conventional case, the skew Δt4 causes the potential of a selected word line WL to lower before data is not substantially written into memory cells.

In the present invention, however, the bank precharge enable signal AUTPE is output on the basis of the pulse signal CSLCK. Therefore, if the pulse signal CSLCK delays by Δt4, the control signal AUTPG also delays by Δt4. As a result, bank precharge is started and the potential of the selected word line WL is lowered, after the final burst data is substantially written into a memory cell. This means that no write error will occur.

The period of time delayed by the auto precharge delay circuit 17 shown in FIG. 9 (specifically shown in FIG. 14 or 15) is determined on the basis of the relationship between the time required until data is substantially written into memory cells after the column select line CSL is activated, and the time required until the potential of the selected word line is lowered after the start of the bank precharge operation.

In this example, even when a skew exists between the clock VCLK (=CLKIN) and the signal VDQS (=DQS), and the signal DQS delays from the clock VCLK, the time required until the potential of a presently-selected word line WL is lowered after the final data is completely written is kept constant. This means that the potential of the selected word line WL is always lowered after data is substantially written into memory cells. Thus, even when such a skew exits, no write error will occur.

THIRD EXAMPLE

Figure 18:
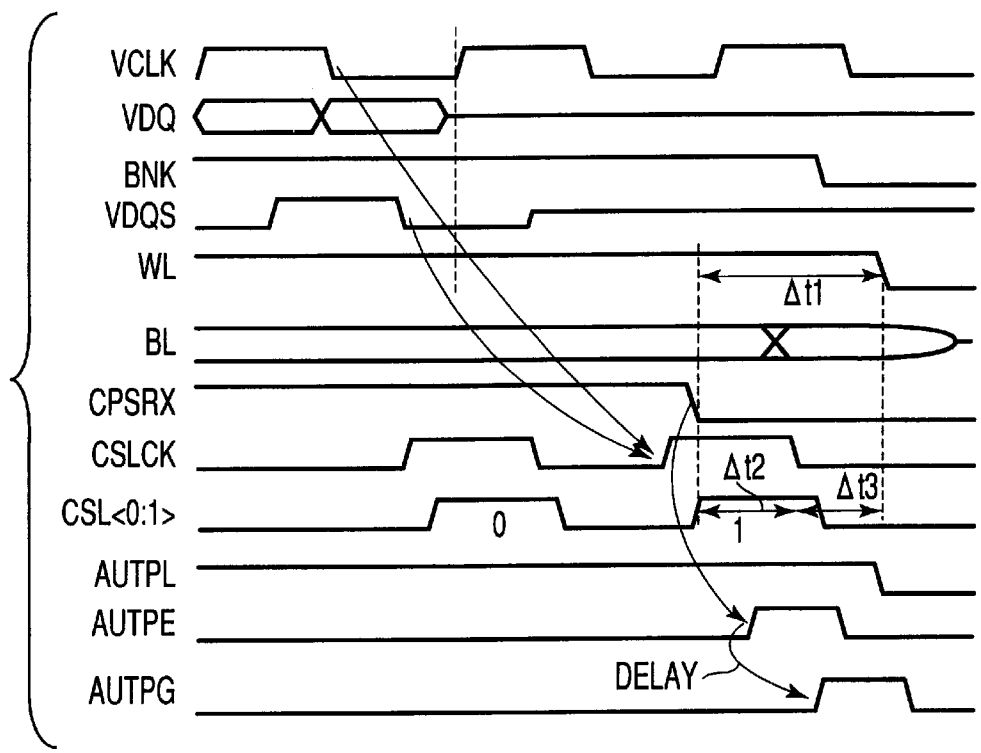
FIG. 18 is a view of signal waveforms used in a third example of the present invention.

FIG. 18 shows signal waveforms used in the write & auto precharge mode in a third example of the present invention.

Referring to FIGS. 9 and 18, the operation of the third example will be described.

The third example is directed to a semiconductor memory in which the pulse signal CSLCK is activated when the signal DQS="L" and the clock VCLK="L". In this example, if the signal DQS is input earlier than or at the same time as the clock, the pulse signal CSLCK assumes "H" since VCLK="L". On the other hand, if the signal DQS is input later than the clock, the pulse signal CSLCK assumes "H" since DQS="L".

The pulse signal CSLCK to be input to the auto precharge decoder 14' is generated by a pulse generator as shown in FIG. 12.

When the write & auto precharge command is input to the chip, the column select line enable signal CPSRX and the auto precharge signal AUTPL assume their active states ("H") as in the conventional case. After finishing the column burst operation, the column select line enable signal CPSRX lowers to "L", as in the conventional case. Further, in this example, since data is input into the chip in synchronism with the DQS signal, the control signal CSLCK is raised to "H" by the pulse generator shown in FIG. 11 when the DQS signal has been lowered.

When CPSRX="L" and AUTPL="H", if CSLCK="H", the output signal (auto precharge enable signal) AUTPE of the auto precharge decoder 14' shown in FIGS. 9 and 13 rises to "H". Thus, in the present invention, the auto precharge enable signal for starting auto precharge rises to "H" if the control signal CSLCK rises to "H". In other words, the point of time at which the auto precharge enable signal rises to "H" does not depend upon the leading edge of the external clock VCLK, unlike the conventional case.

The auto precharge enable signal AUTPE (="H") is delayed by a predetermined period by the auto precharge delay circuit shown in FIG. 14 or 15, and then output as a control signal AUTPG (="H"). The bank controller 16 outputs a bank precharge signal BNK based on the control signal AUTPG. As a result, bank precharge is started and the potential of the selected word line WL is lowered.

In this example, if the signal DQS delays by Δt4 from the clock VCLK (=CLKIN), the pulse signal CSLCK also delays by Δt4, and accordingly no write error will occur, as in the second example.

The period of time delayed by the auto precharge delay circuit 17 shown in FIG. 9 (specifically shown in FIG. 14 or 15) is determined on the basis of the relationship between the time required until data is substantially written into memory cells after the column select line CSL is activated, and the time required until the potential of the selected word line is lowered after the start of the bank precharge operation.

This example can provide the same advantage as the second example. That is, even when a skew exists between the clock VCLK (=CLKIN) and the signal VDQS (=DQS), and the signal DQS delays from the clock VCLK, the time required until the potential of a presently-selected word line WL is lowered after the final data is completely written is kept constant. This means that the potential of the selected word line WL is always lowered after data is substantially written into memory cells. Thus, even when such a skew exits, no write error will occur.

FOURTH EXAMPLE

Figure 19:
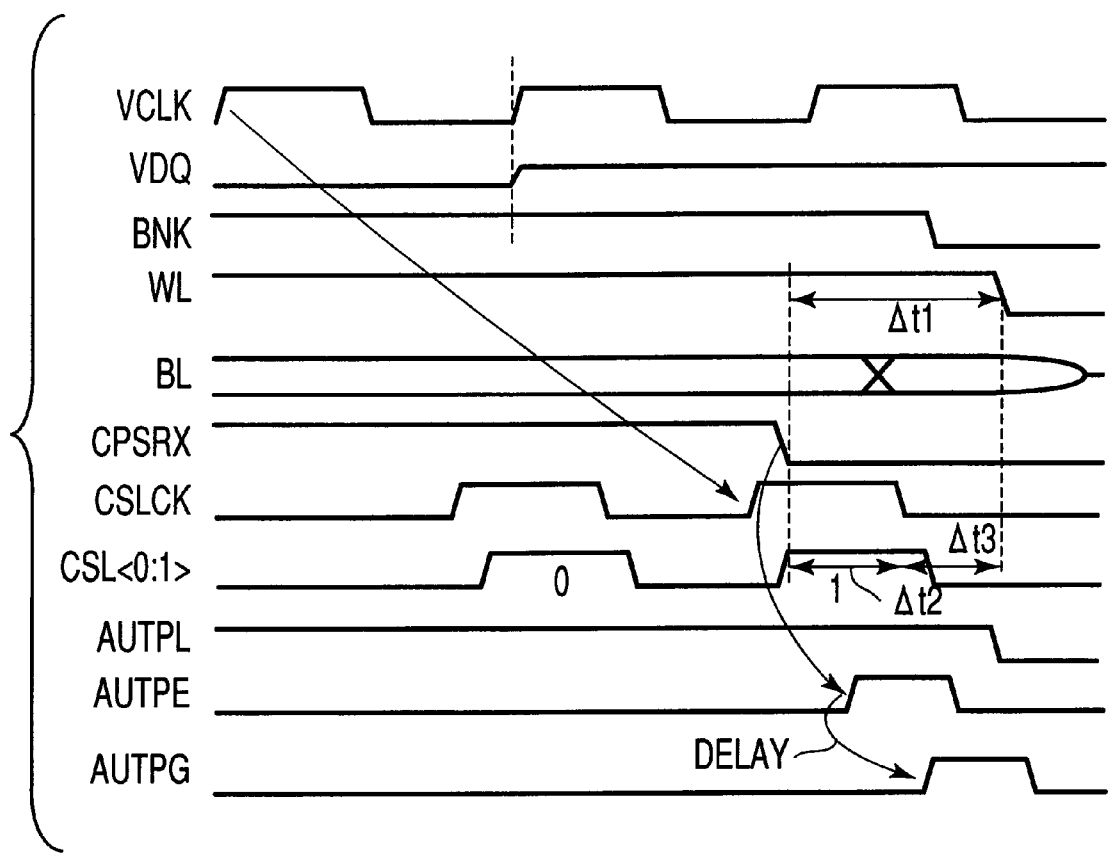
FIG. 19 is a view of signal waveforms used in a fourth example of the present invention.

FIG. 19 shows signal waveforms used in the write & auto precharge mode in a fourth example of the present invention.

Referring now to FIGS. 9 and 19, the operation of the fourth example will be described.

The fourth example is directed to a semiconductor memory in which only the "H" level of a clock is used to input data into the chip, as in the conventional SDRAM. In this example, WCL=0.

When the write & auto precharge command is input to the chip, the column select line enable signal CPSRX and the auto precharge signal AUTPL assume their active states ("H"), as in the conventional case. After finishing the column burst operation, the column select line enable signal CPSRX lowers to "L", as in the conventional case. Also, in this example, the control signal CSLCK rises to "H" in synchronism with the "H" level of the clock.

When CPSRX="L" and AUTPL="H", if CSLCK="H", the output signal (auto precharge enable signal) AUTPE of the auto precharge decoder 14' shown in FIGS. 9 and 13 rises to "H". Thus, in the present invention, the auto precharge enable signal for starting auto precharge rises to "H" if the control signal CSLCK rises to "H". In other words, the point of time at which the auto precharge enable signal rises to "H"does not depend upon the leading edge of the external clock VCLK, unlike the conventional case.

The auto precharge enable signal AUTPE (="H") is delayed by a predetermined period by the auto precharge delay circuit shown in FIG. 14 or 15, and then output as a control signal AUTPG (="H"). The bank controller 16 outputs a bank precharge signal BNK based on the control signal AUTPG. As a result, bank precharge is started and the potential of a selected word line WL is lowered.

The period of time delayed by the auto precharge delay circuit 17 shown in FIG. 9 (specifically shown in FIG. 14 or 15) is determined on the basis of the relationship between the time required until data is substantially written into memory cells after the column select line CSL is activated, and the time required until the potential of the selected word line is lowered after the start of the bank precharge operation.

Although, in this example, even when the frequency of the external clock is high in a single-data type SDRAM, the column select line CSL is kept in the active state. Accordingly, bank precharge is started and the potential of the selected word line WL is lowered, after data is substantially written into memory cells. For this reason, no write error will occur.

Furthermore, when the frequency of the external clock is high, the number of clock pulses that define the write recovery time tWR is increased (see FIG. 8) as in the conventional case. However, even in this case, no circuit for shifting the auto precharge enable signal AUTPE in synchronism with the clock is necessary. This means that it is sufficient if the existing auto precharge delay circuit is used, and therefore the time required for designing and developing the semiconductor memory can be shortened.

ADVANTAGES OF THE INVENTION

As described above, the write recovery time tWR can be set so that it does not depend upon the clock, and write errors can be prevented without changing the circuit structure even when a clock of a higher frequency is used. Moreover, in the case of an SDRAM using the DQS signal, write errors due to delay of the DQS signal can be avoided.

Thus, in the present invention, bank precharge is started in the write & auto precharge mode, without making it depending upon the clock, when the write recovery time tWR has elapsed after the column operation. This also enables the semiconductor memory to be compatible, without changing its circuit, with a clock of a higher frequency in the future and with an according increase in the number of clock pulses that define the write recovery time tWR.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
    a generator for generating a pulse signal, used to operate a column decoder, on the basis of a clock signal and a first control signal;
    a precharge decoder for outputting a second control signal, used to control an operation of a row decoder, on the basis of the first control signal and the pulse signal; and
    a delay circuit operable independent of the clock signal for delaying the second control signal by a predetermined time period.

2. The semiconductor memory according to claim 1, wherein when the first control signal is activated, the pulse signal is generated from the generator, and when the first control signal is not activated, the second control signal is activated, and a potential of a selected word line is at a non-selection level.

3. The semiconductor memory according to claim 2, wherein the precharge decoder receives a third control signal, and the second control signal is activated when the third control signal is activated.

4. The semiconductor memory according to claim 3, wherein the third control signal is activated in an auto precharge mode, in which data is written into memory cells connected to the selected word line, and then the potential of the selected word line has the non-selection level and bank precharge is started.

5. The semiconductor memory according to claim 2, wherein the potential of the selected word line has the non-selected level, irrespective of the clock signal, when a predetermined time period has elapsed after the pulse signal is output.

6. The semiconductor memory according to claim 1, wherein the clock signal is input to the generator and not to the delay circuit.

7. The semiconductor memory according to claim 1, further comprising a burst length counter to be activated in a write mode, thereby latching a burst signal and outputting the first control signal.

8. The semiconductor memory according to claim 7, wherein the first control signal is a column select line enable signal.

9. The semiconductor memory according to claim 1, wherein the predetermined time period is equal to a write recovery time.

10. The semiconductor memory according to claim 1, further comprising a bank controller for outputting a bank precharge signal based on the second control signal, and wherein when the bank precharge signal is input to the row decoder, bank precharge is executed and the potential of a selected word line has a non-selection level.

11. The semiconductor memory according to claim 1 being a synchronous DRAM having a plurality of banks.

* * * * *